United States Patent [19]

Itoh et al.

[11] Patent Number: 4,796,234

[45] Date of Patent: Jan. 3, 1989

[54] SEMICONDUCTOR MEMORY HAVING SELECTIVELY ACTIVATED BLOCKS INCLUDING CMOS SENSE AMPLIFIERS

[75] Inventors: Kiyoo Itoh, Higashikurume; Yoshiki Kawajiri, Hachioji; Katsutaka Kimura, Sagamihara; Ryoichi Hori, Tokyo; Jun Etoh, Hachioji, all of Japan

[73] Assignee: Hitachi, Ltd., Tokyo, Japan

[21] Appl. No.: 927,144

[22] Filed: Nov. 5, 1986

[30] Foreign Application Priority Data

Nov. 5, 1985 [JP] Japan ................... 60-247578

[51] Int. Cl.$^4$ .............................................. G11C 7/00
[52] U.S. Cl. ..................................... 365/227; 365/63;
365/181; 365/230
[58] Field of Search ............... 365/189, 205, 207, 208,
365/227, 233, 63, 72, 190, 181, 222

[56] References Cited

U.S. PATENT DOCUMENTS

| | | | |
|---|---|---|---|
| 4,222,112 | 9/1980 | Clemons et al. | 365/203 |
| 4,482,984 | 11/1984 | Oritani | 365/189 |
| 4,528,646 | 7/1985 | Ochii et al. | 365/203 |

FOREIGN PATENT DOCUMENTS 0166642 1/1986 European Pat. Off. ............ 365/205

Primary Examiner—Stuart N. Hecker
Assistant Examiner—Glenn A. Gossage
Attorney, Agent, or Firm—Antonelli, Terry & Wands

[57] ABSTRACT

It is contemplated to realize a semiconductor memory with a large memory capacity, high in integration and low in power dissipation. A semiconductor memory is disclosed, comprising a plurality of blocks each having a memory cell array and sense amplifier(s) to differentially amplify signals read out from the array, wherein a common driving line of amplifiers composed of N-channel MOS transistors among said sense amplifiers and a common driving line of amplifiers composed of P-channel MOS transistors among the sense amplifers are connected between different blocks.

13 Claims, 16 Drawing Sheets

SEMICONDUCTOR MEMORY HAVING SELECTIVELY ACTIVATED BLOCKS INCLUDING CMOS SENSE AMPLIFIERS

BACKGROUND OF THE INVENTION

This invention relates generally to semiconductor memories and more particularly, to a semiconductor memory suitable for suppressing a spike current of a dynamic MOS memory.

As the memory capacity of dynamic MOS memories has been increased, a spike current flowing through a chip has become one of the significant design factors in order to suppress noise. In order to suppress a charging current that flows when charging data lines simultaneously at the time of precharge, there has been employed in the past a method which divides a memory array into a plurality of sub-arrays and staggers the timing of the spike current (charging current) applied to each sub-array so as to reduce effectively the spike current of the chip as a whole, as described, for example, in IEEE J. "Solid-State Circuits", pp. 585–590, October 1984.

However, this method deals with the precharge spike current after completion of an amplification operation where a small signal voltage is read out from a memory cell and is amplified and the data line voltage reaches 0 V or 5 V. The precharge method precharges the data line to a $V_{cc}$ (power source voltage, ordinarily 5 V). In other words, the method does not deal with the timing of the small signal voltage from the memory cell, that is, the spike current at the time of amplification. However, as the memory capacity of memories has been increased in recent years, the increase in consumed power resulting from the increase of the charging/discharging current of the data line has become a critical problem. To solve this problem, a system which precharges the data line to $V_{cc}/2$ (2.5 V) and a system which combines CMOS sense amplifiers as a sense amplifier, that is, sense amplifiers consisting of N-channel MOS transistors, with sense amplifiers consisting of P-channel transistors have become important. The system, however, causes a spike current to flow at the time of amplification which is a problem as will be described elsewhere. If the spike current becomes great at the time of amplification, noise is induced inside the semiconductor chip and stable operation at the time of amplification becomes impossible. In such systems, the width of the aluminum wiring has been increased, for example, to solve this problem in, but this method invites another problem in that the chip area increases remarkably. Unlike the $V_{cc}$ precharge system, the current flowing through the current line at the time of precharge in this system is almost negligibly small because precharge may be made inside the data line. Even if division of the driving system used for the conventional $V_{cc}$ precharge system is applied to such a $V_{cc}/2$ precharge system, stable operation is not possible because noise becomes too great. In other words, let's consider the case where pulses are applied to word lines of a certain two sets of sub-arrays and small signal voltages appear from the memory cells on the respective word lines. Under this state, let's consider the time zone in which the sense amplifier of a certain subarray starts operating but the sense amplifier in another sub-array is still inoperative. At this time, the voltage change of the data line inside the sub-array whose sense amplifier is operating is great, and this is coupled as noise with another sub-array whose sense amplifier is still inoperative, through various parasitic capacitances. In consequence, the sub-array under the inoperative state cannot operate stably due to the noise when it tries to amplify the signal voltage when it subsequently enters the operative state.

For the reason described above, it is very important in the $V_{cc}/2$ precharge system to reduce the spike current inside the sub-arrays at the time of amplification in order to reduce the chip area and to insure stable operation. These problems will be further described by use of a circuit produced tentatively by the inventors of the present invention.

FIGS. 2A, 2B and 3 show an structural example of a 1M-bit dynamic memory produced by the present inventors.

Incidentally, this circuit is produced tentatively with reference to K. Sato et al "A 20ns Static Column 1 Mb DRAM in CMOS Technology", ISSCC Digest of Technical Papers, pp. 254, February 1985, shown in FIG. 1A and Japanese Patent Laid-Open No. 198592/1982.

The sense system in this circuit is simplified for ease of description. Address signals various clock signals or various clock signals inherent to an address multiplex system are also omitted.

FIG. 2A shows a block $BLK_0$ consisting of 256-bit subarrays MA, sense amplifiers NS consisting of N-channel MOS transistors, sense amplifiers PS consisting of P-channel transistors and precharge circuits PC. Folded data line cells are used for the memory cells MC. Such memory cells are described in detail in K. Itoh and H. Sunami, "High Density One-Device Dynamic MOS Memory Cells", IEE PROCE., Vol. 130, ptl, No. 3, June, 1983, pp. 127, for example.

1024 memory cells are connected to one word line, and the precharge circuits PC and the sense amplifiers PS, NS are connected to the corresponding 1024 pairs of data lines ($D_0$, $\overline{D}_0$, ... $D_{1023}$, $\overline{D}_{1023}$). Four such blocks constitute the 1M-bit chip.

Next, the operation of the block shown in FIG. 2A will be explained with reference to the timing chart of FIG. 3. In FIG. 3, symbol $\phi P$ represents a precharge signal, $W_0$–$W_{225}$ are voltages applied to the word lines, $\phi_{ND}$ and $\phi_{PD}$ are voltages of the sense driving circuits consisting of N- and P-channel MOS transistors, respectively, and $i_N$ and $i_P$ are currents flowing through common driving lines $CL_{00}$ and $CL_{01}$.

After all the data lines $D_0$–$D_{1023}$ and the driving lines $CL_{00}$, $CL_{10}$ of the sense amplifiers NS, PS, and the like are charged to a half voltage ($V_{cc}/2$; ordinarily $V_{cc}=5$ V so $V_{cc}/2=2.5$ V), an X decoder (XDEC) and an X driver (XD) are selected by a plurality of address signals (not shown). Thereafter, the clock $\phi_x$ is applied and a pulse is applied to the selected word line (e.g. $W_0$). Accordingly, the read signal voltage is outputted from the 1024 memory cells connected to the selected word line $W_0$ in accordance with the data stored in the capacitor $C_s$ to the corresponding data lines. This voltage is substantially proportional to $V_{ST}C_S/C_D$ with $C_D$ representing the parasitic capacitance of the data line and $V_{ST}$ being the stored voltage in the capacitor $C_S$.

Ordinarily, $C_S/C_D$ is a small value and $V_{ST}$ is 5 V when the logic is "1" and 0 V when the logic is "0". Accordingly, the read signal voltage is about 200 mV. FIG. 3 shows only the voltage waveform to the data line $D_0$ when the 5 V voltage is stored in the memory cells connected to the data line $D_0$. Since no memory cell is connected to the other data line $\overline{D}_0$ of the data line pair, the voltage remains 2.5 V. Incidentally, a dummy cell may be connected to the data line $\overline{D}$ in order to offset the noise at the time of read-out as is well known in the art, but such an arrangement is hereby omitted because it is irrelevant to the subject matter of the present invention. Next, when $\phi_{ND}$ and $\phi_{PD}$ are ON, the drivers ND and PD operate and the sense amplifiers NS and PS operate in response thereto so that the small signal voltages on the data line pair are differentially amplified. Thereafter, a Y decoder (YDEC) and a Y driver (YD) selected by a plurality of address signals select $Y_0$, for example, and the amplified signals on the data line pair $D_0$, $\overline{D}_0$ are outputted to an I/O line pair and become data output $D_0$. The write operation is made in the reverse route to the read operation as is well known, so that the data input $D_i$ is controlled by a write control signal WE and desired data is written into the selected memory cell. As described clearly in the aforementioned references, $Y_0$-$Y_{1023}$ are wired in common to each sub-array by three-dimensional wiring and control data exchange between the data line pair inside each sub-array and the I/O line. Though four I/O line pairs belonging to each block $BLK_0$-$BLK_4$ exist in FIG. 2B, it is possible to employ the construction in which they independently make the data exchange with circuits outside the chip in parallel with the chip or the construction in which the four I/O line pairs are decoded by address signals to form one set of $D_i$ and $D_0$ when viewed from outside the chip. However, since they are irrelevant to the subject matter of the present invention, the detailed description is hereby omitted.

The problem with the operation of the device that has been described so far is that the currents flowing through the common driving lines $CL_{00}$, $CL_{10}$ are as great as from 200 to 300 mA because the 1024 sense amplifiers NS, and PS operate simultaneously inside one block. Ordinarily, $CL_{00}$, and $CL_{10}$ wiring is made by aluminum in order to prevent the voltage drop of the wiring resistance due to the excessive current and to reduce the noise, but the wiring must be from 50 to 100 $\mu$m width, for example, in order to accommodate the periodic increases in current. In a 1M-bit memory, a data line is divided by four in order to reduce the parasitic capacitance and to increase the signal voltage from the memory cell, as shown in FIG. 2B. If the memory capacity is to be further increased, the number of divisions of the data line must also increase causing wiring width of $CL_{00}$, $CL_{10}$ to increase, which results in the further increase of the chip area.

SUMMARY OF THE INVENTION

A semiconductor memory of the type including a block which has at least a memory cell array and CMOS sense amplifiers for differentially amplifying signals read out from the memory cell array is divided into a plurality of sub-blocks, the semiconductor memory in accordance with the present invention alternately drives the CMOS sense amplifiers between the sub-blocks. In other words, a common driving line of the amplifiers constituted by N-channel MOS transistors among the CMOS sense amplifiers and a common driving line of the amplifiers constituted by P-channel MOS transistors are wired between different sub-blocks.

It is an object of the present invention to solve the afore-mentioned problems of the prior art technique.

It is another object of the present invention to reduce the current flowing through a common driving line of a sense amplifier at the time of amplification while maintaining low noise characteristics.

It is still another object of the present invention to provide a semiconductor memory which can operate stably without increasing chip area.

A further object of the present invention to provide a semiconductor memory which can operate at high speeds without increasing current.

These and other objects and attendant advantages of this invention will be readily appreciated from the following detailed description when considered in connection with the accompanying drawings.

DESCRIPTION OF THE PREFERRED EMBODIMENTS

Hereinafter, some preferred embodiments of this invention will be described in detail with reference to the accompanying drawings.

[Embodiment 1]

Figure 4:
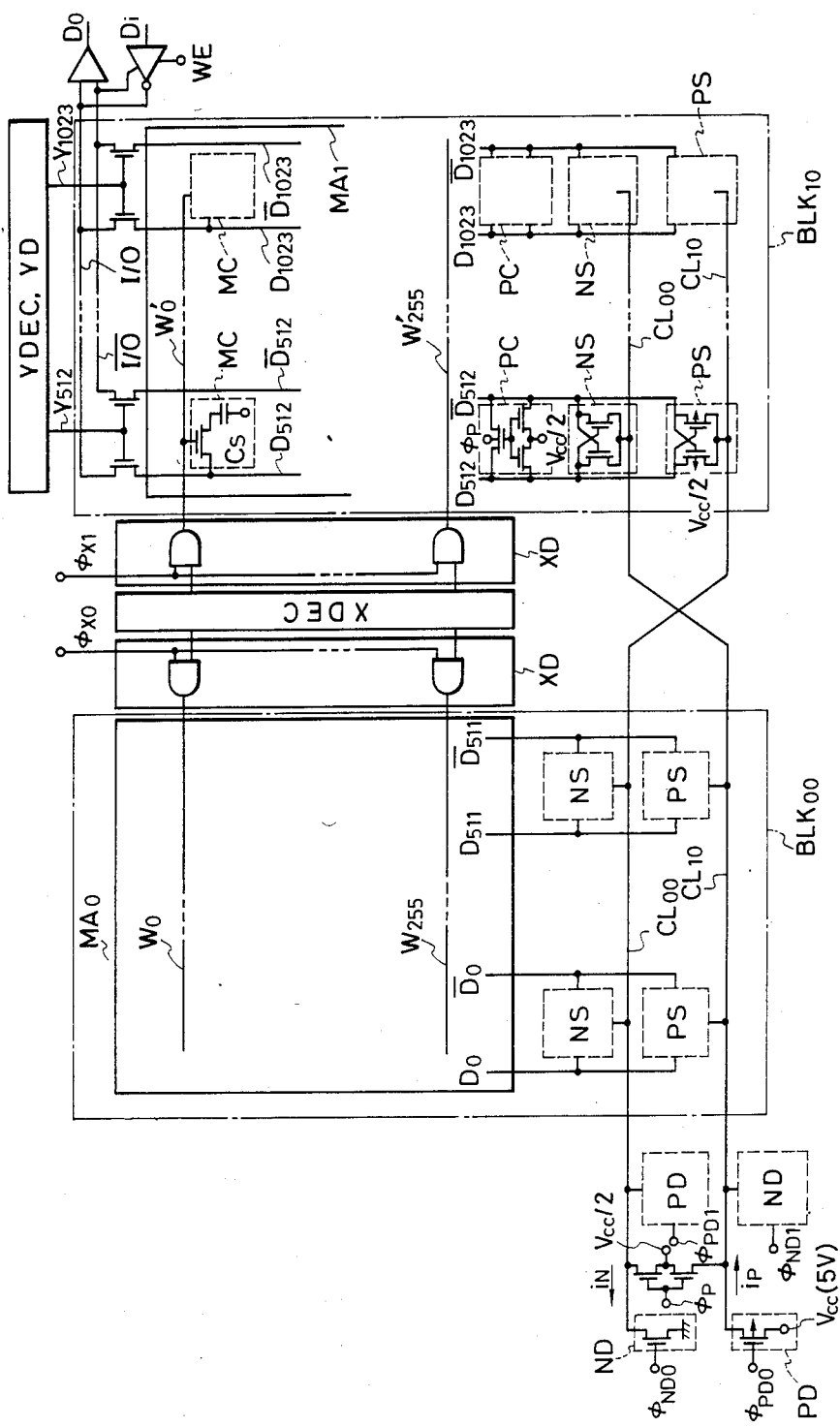
FIGS. 4 through 7 are circuit diagrams and timing charts of a first embodiment of the present invention.
Figure 5:
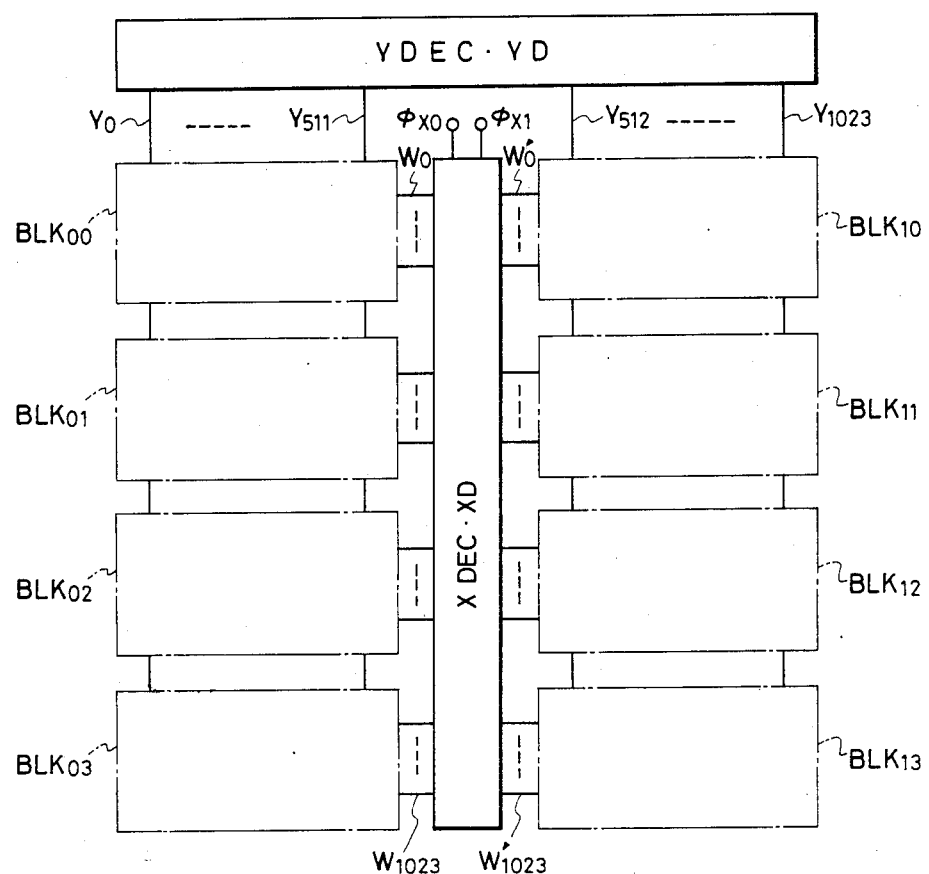

FIG. 4 is a circuit diagram of a semiconductor memory in accordance with a first embodiment of the present invention. Here, a memory array is divided into two sub-arrays $MA_0$ and $MA_1$, and a common drive line of a group of sense amplifiers NS which consist of MOS transistors and belong to one of the sub-arrays (e.g. $MA_0$) and a common drive line of a group of sense amplifiers PS consisting likewise of MOS transistors and belong to the other sub-array (e.g. $MA_1$) are wired at the place of division of the memory array. Similarly, a common drive line of a group of sense amplifiers PS belonging to the sub-array $MA_0$ is wired to a common drive line of a group of sense amplifiers NS belonging to $MA_1$. The sense amplifiers NS, PS and the portion containing the memory array constitute blocks $BLK_{00}$ and $BLK_{10}$. A plurality of these blocks are connected to constitute a memory chip such as shown in FIG. 5 and analogues to the memory chip shown in FIG. 2. Since precharge circuits, I/O wirings YDEC, YD, and the like of $MA_1$ are common to those of $MA_0$, those of $MA_0$ are either simplified or omitted. The novel features of this circuit are as follows.

(a) Only the word line belonging to one of the divided memory arrays is selected.
(b) Only the sense amplifiers belonging to the selected word line are activated without an increase in the number of common drive line.

As described above, this embodiment provides the method of dividing the block, the method of driving the divided blocks, the connection method of the common drive lines and the method of driving the common drive lines by disposing a plurality of blocks, and connecting mutually the common drive lines of a plurality of sense amplifiers consisting of N-channel MOS transistors of certain block(s) with the common drive lines of sense amplifiers consisting of P-channel MOS transistors of other blocks in order to prevent the increase in the number of the common drive lines, to make non-selective the word line of the non-selected blocks just at the time when the sense amplifiers of the selected block operate and at the same time, to make nonoperative the sense amplifiers of the non-selected blocks and thus to reduce power consumption.

Figure 6:
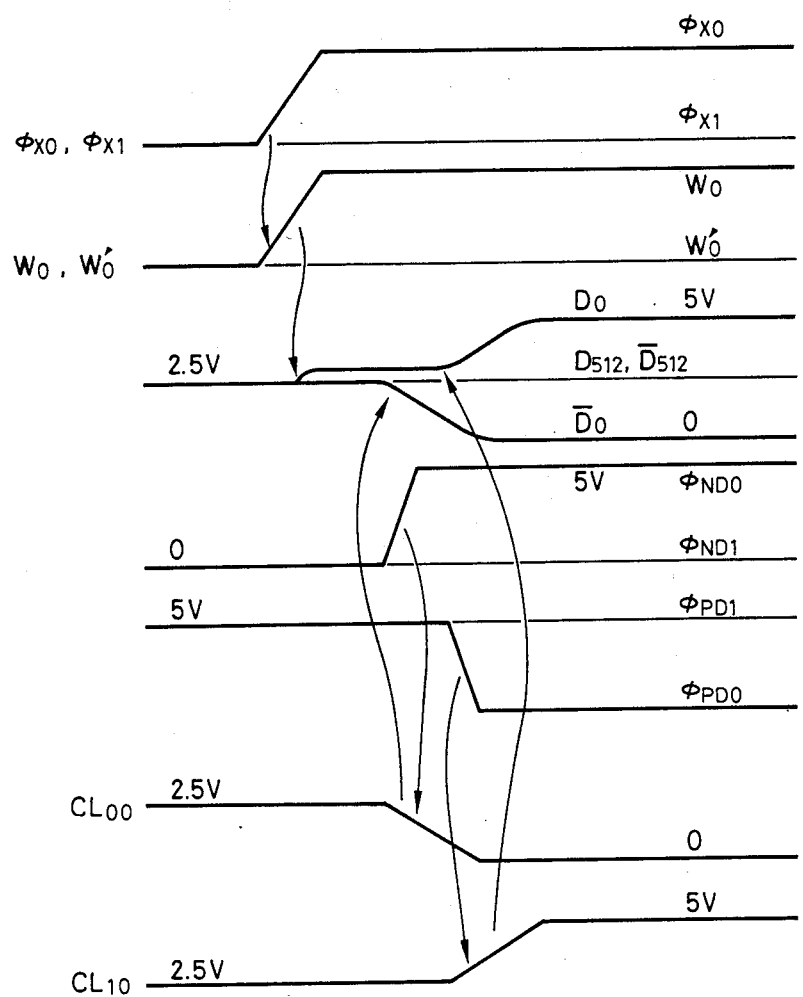
Figure 7:
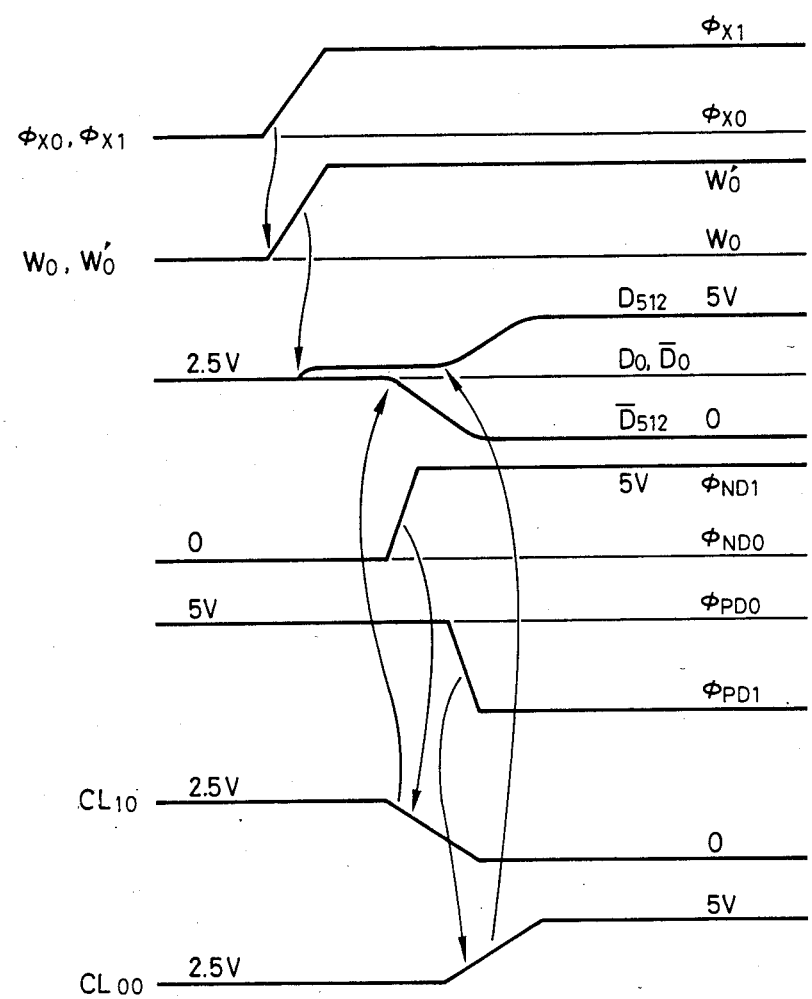

FIGS. 6 and 7 are operation time charts of FIG. 4. FIG. 6 shows the operation in the case where the memory array $MA_0$ is selected while FIG. 7 shows the operation in the case where the memory array $MA_1$ is selected. Either one of the sub-arrays $MA_0$ and $MA_1$ is selected by turning on either one of clocks $\phi_{x0}$ and $\phi_{x1}$ (e.g. $\phi_{x0}$) after an X decoder is selected so as to turn on the corresponding word line (e.g. $W_0$) as shown in the timing chart of FIG. 6. Accordingly, a memory cell read signal voltage is outputted to data line pair inside the sub-array $MA_0$. Next, when a pulse is applied to $\phi_{ND0}$, the common drive line $CL_{00}$ is driven by a drive circuit for the sense amplifiers so that the sense amplifier NS is activated and amplifies the data lines in a discharge direction. Next, when a pulse is applied to $\phi_{PD0}$, the drive circuit for the sense amplifiers PD drives the common drive line $CL_{10}$ so that the sense amplifier PS is activated and further amplifies the data line in a charge direction.

It is hereby noteworthy that though the pulse applied to the common drive line $CL_{00}$ and $CL_{10}$ is also applied to the sense amplifiers NS and PS belonging to the non-selected memory array $MA_1$, these sense amplifiers NS and PS are not activated because the polarity of applied pulse is always in such a direction that cuts off the sense amplifiers NS and PS. This will be obvious in view of the fact that all the data line voltages inside the non-selected memory array $MA_1$ are kept at the precharge voltage 2.5 V and $CL_{00}$ and $CL_{10}$ are crossed at the point of division of the memory array. When the memory array $MA_1$ is to be selected, on the contrary, the pulse is applied to $\phi_{ND1}$, $\phi_{PD1}$ as shown in FIG. 7.

Incidentally, it is possible to use ordinary folded data line cells as the memory cells. In such a case, each word line is made of a material having relatively high resistance such as polysilicon or polycide and when its delay time becomes a problem, it is possible to make the word line shunted by aluminum wirings in the unit of a plurality of memory cells to speed up the operation. Since the data line is ordinarily the aluminum wiring, shunt of the word line may better be made by the second aluminum wiring as the upper layer. It is preferred to use the aluminum wiring also for the drive line CL.

[Embodiment 2]

Figure 8:
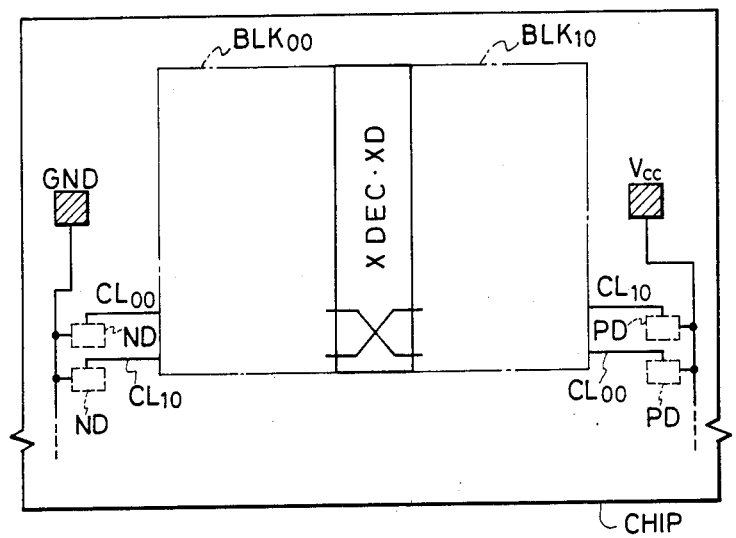
FIG. 8 is a circuit diagram of a second embodiment of the present invention.

FIG. 8 is a schematic plan view showing the disposition of the semiconductor memory in accordance with the second embodiment of the present invention.

Figure 2A:
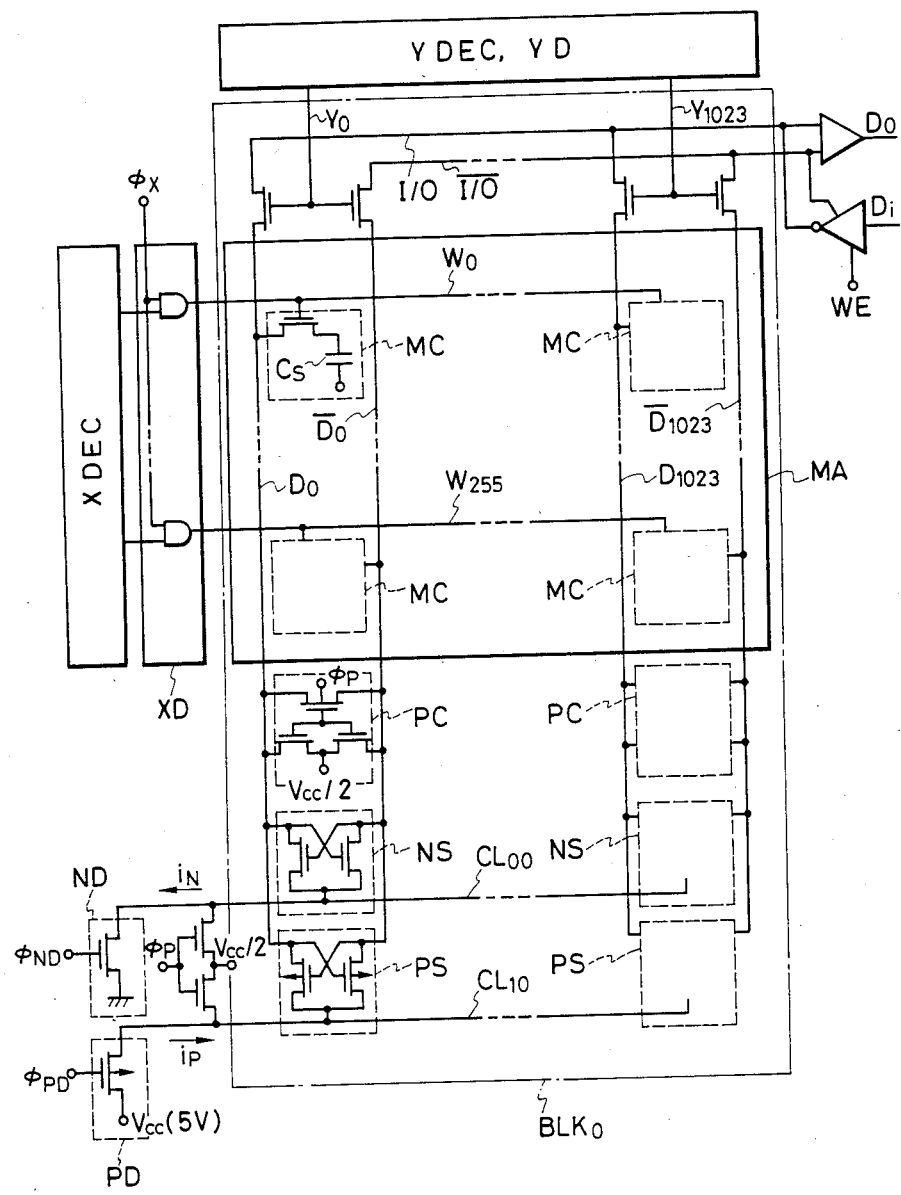
FIGS. 2A, 2B and 3 are circuit diagrams showing the memory produced tentatively by the inventors of the present invention.

In FIG. 2A, when a pad for a grounding power source which supplies power from outside by bonding wires is disposed on the left of the block $BLK_{00}$ and a pad for a $V_{cc}$ power source is disposed on the right of the block $BLK_{10}$, the sense amplifier drive circuit ND is preferably disposed on the left of $BLK_{00}$ with the sense amplifier drive circuit PD on the right of $BLK_{10}$ as shown in FIG. 8. Unless this disposition is used, the power source lines of ND and PD must be extended to the power source pad along the outer periphery of the block and the chip area increases thereby. Furthermore, the sense amplifiers to be connected to the common drive line $CL_{00}$ in FIG. 8 are NS in the block $BLK_{00}$ and PS in the block $BLK_{10}$, and the sense amplifiers activated by $CL_{00}$ are always inside the block which is close to the driver ND or PD. On the other hand, in the case of $CL_{10}$, the sense amplifiers existing in the spaced-apart blocks are activated. Therefore, the wiring width of $CL_{00}$ may be made smaller than that of $CL_{10}$ in order to reduce the speed difference between them at the time of amplification.

As described above, this embodiment can reduce to half the spike current flowing through the common drive line at the time of amplification without increasing the number of common drive lines so that the width of the aluminum wiring of the common drive line can be reduced when compared with that of the conventional memory. For this reason, a semiconductor memory having a reduced chip area can be accomplished while maintaining low noise characteristics.

[Embodiment 3]

Figure 9:
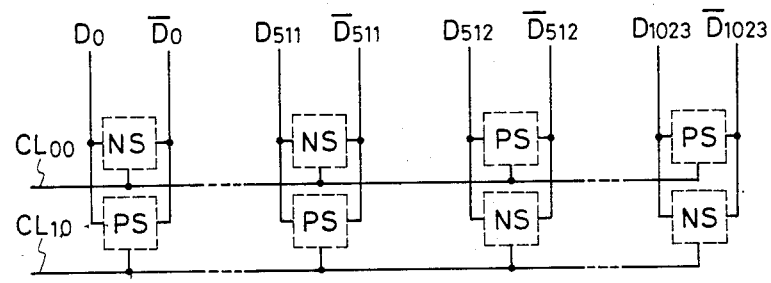
FIG. 9 is a circuit diagram of a third embodiment of the present invention.

FIG. 9 is a structural view showing the principal portions of the semiconductor memory in accordance with the third embodiment of the present invention. This embodiment illustrates the arrangement wherein the disposition of the sense amplifiers NS and PS belonging to the divided memory arrays are mutually reversed on the data lines so that $CL_{00}$ and $CL_{10}$ do not cross on the point of division of the memory array.

Generally, a large spike current flows through $CL_{00}$ and $CL_{10}$. Therefore, layout is employed in FIG. 2A to minimize the resistance of crossing portion by using two-layered aluminum wirings or the like, and this results in the increase of the area of the crossing portion and this portion cannot be used effectively for the layout of other circuits. This embodiment can solve this problem. Incidentally, though FIG. 2A shows the case where PS is connected to the extreme end portion of the data line inside the memory array $MA_0$, for example, in the present embodiment, there is no problem even when NS is connected to the extreme end portion by changing the connection of two kinds of sense amplifiers connected to the same data line.

[Embodiment 4]

Figure 10:
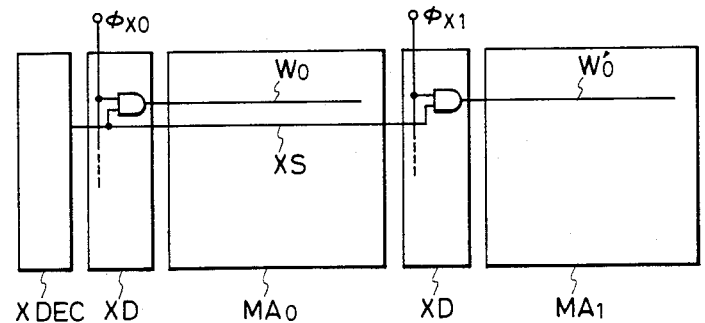
FIG. 10 is a circuit diagram of a fourth embodiment of the present invention.

FIG. 10 is a structural view of the semiconductor memory in accordance with the fourth embodiment of the present invention. This embodiment relates to a method of dividing the word line. The X decoder XDEC is disposed at the end portion of the divided memory arrays and the output line XS of the X decoder XDEC is passed over the memory arrays by a three-dimensional line (for example, XS is the second layer aluminum wiring if the word line is poly-Si or polycide and the data line is the first layer aluminum), and the decoder selection output signal and $\phi_{x0}$ or $\phi_{x1}$ appearing on this XS applies the word pulse to a desired memory array.

As a modified embodiment of this embodiment, it is possible to dispose two drivers XD at the point of division of the memory array. If the X decoder is disposed at the end portion of the memory array in this manner, the layout problem shown in FIG. 2A in that a large number of address wirings from the output of the address buffer circuit at the end portion of the chip must be applied as input to the X decoder through the external portion of the memory array can be solved.

Figure 1A:
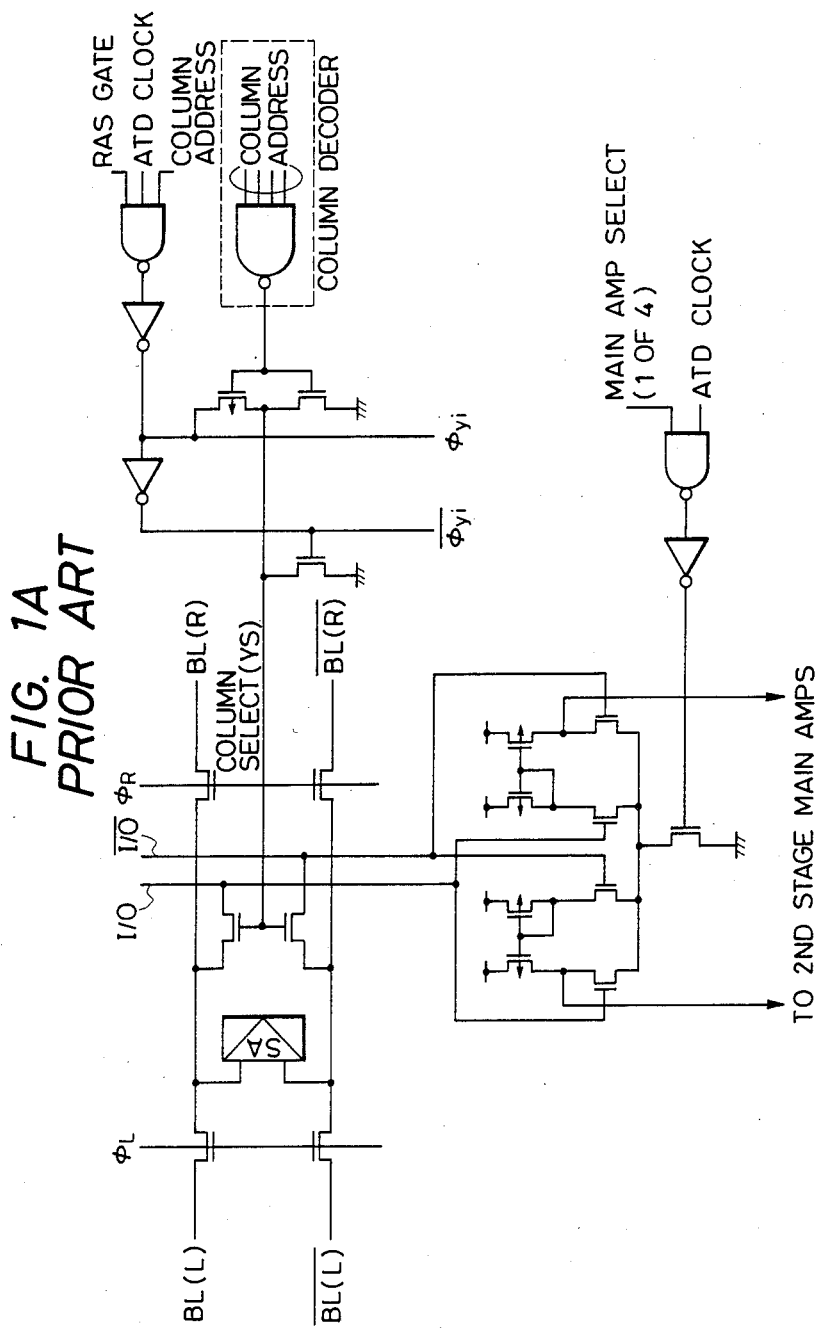
FIGS. 1A and 1B are circuit diagrams showing prior art technique.
Figure 1B:
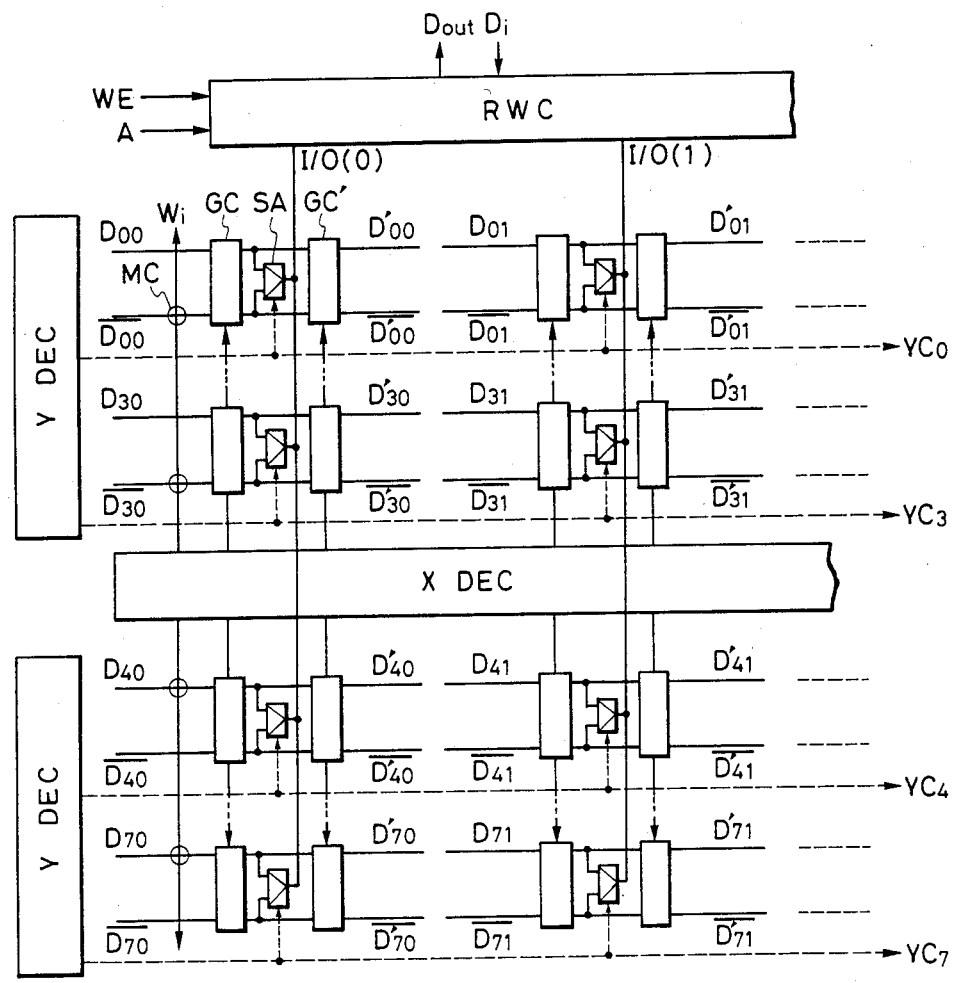
Figure 2B:
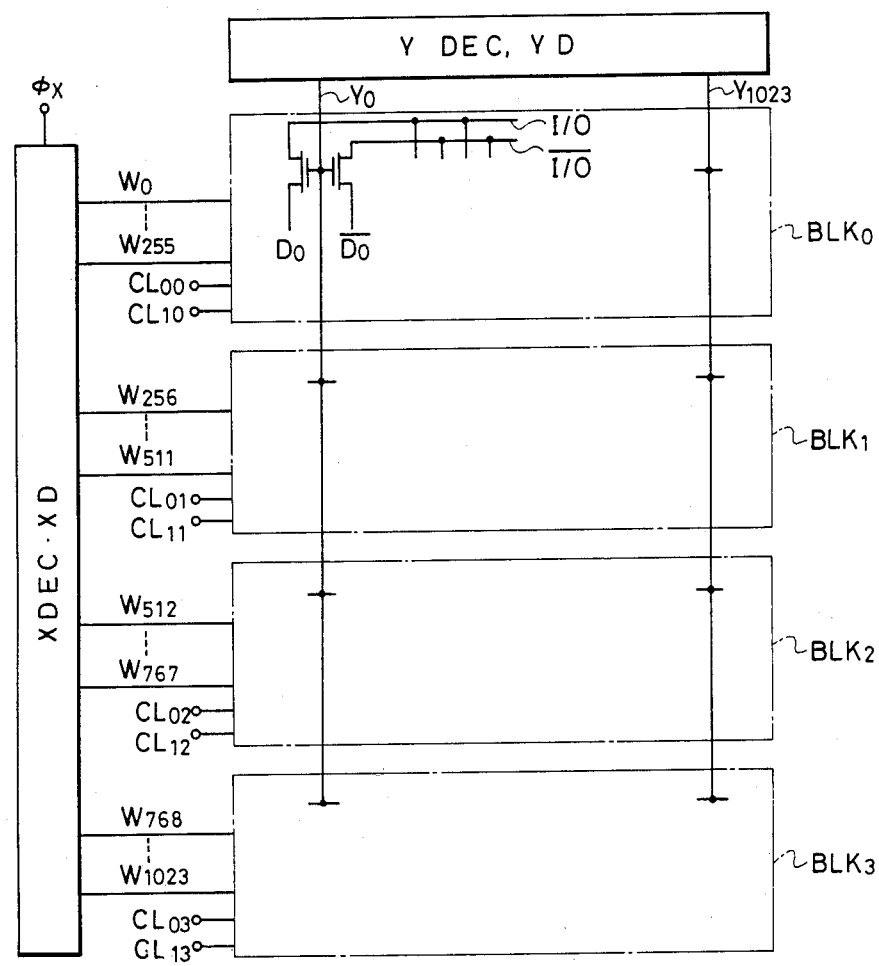
Figure 3:
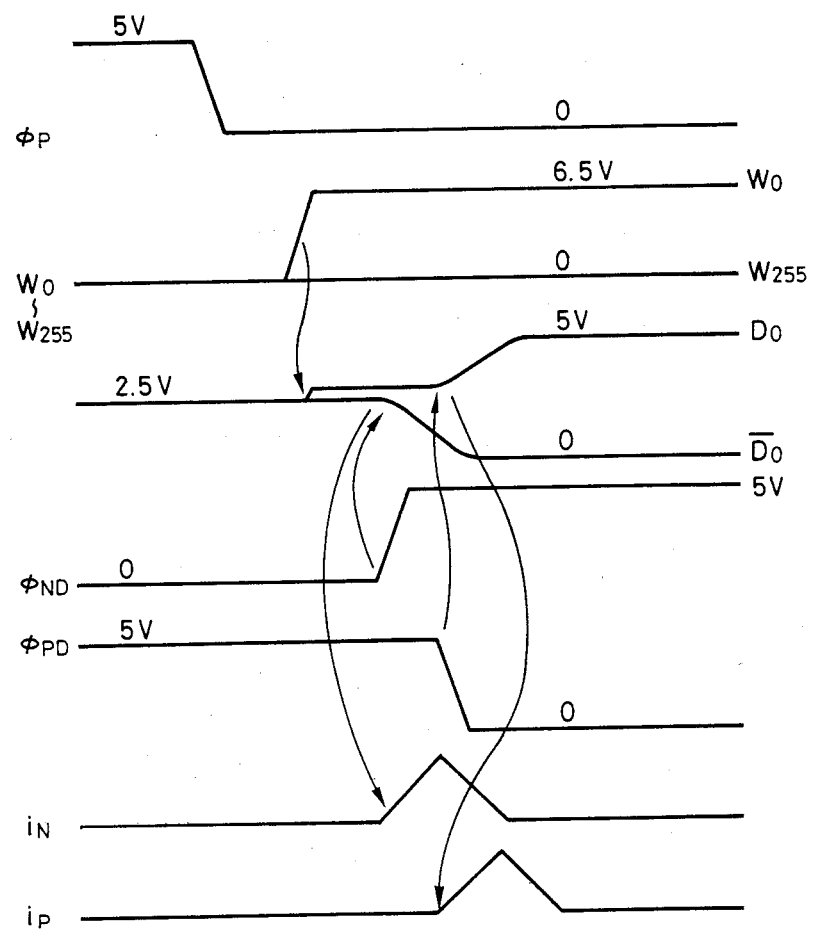

Incidentally, the detailed description of the circuits inside the block shown in FIG. 1 and its modified embodiments are omitted in FIG. 2A because they are irrelevant to the subject matter of the present invention, but it is possible to employ the method of dividing the data line into a plurality of data lines or the method which uses in common the I/O line shown in FIG. 2B for two sets of divided data lines adjacent each other, as disclosed in the aforementioned references. In accordance with this embodiment, the word line is divided and only part of the divided word lines is selected and the pulse voltage is applied thereto. Accordingly, 2,048 sense amplifiers NS and PS must be operated at one time in conjunction with the refresh cycle inherent to the dynamic memory. Conventionally, this refresh operation has been effected by simultaneously selecting two blocks from $BLK_0$–$BLK_3$ in FIGS. 2B and 3. In other words, if $BLK_0$ and $BLK_1$ are selected simultaneously and the pulses are applied to the word lines $W_0$ and $W_{256}$, 2,408, in total, of the memory cells connected to these two word lines are read out and the signals are amplified by the corresponding 2,048 pairs of sense amplifiers (NS, PS) for the refresh operation. In accordance with this embodiment, however, it is necessary to select simultaneously four blocks in FIG. 5, e.g. $BLK_{00}$, $BLK_{01}$, $BLK_{02}$ and $BLK_{03}$, in order to operate simultaneously the 2,048 pairs of sense amplifiers. In other words, the number of blocks to be selected in the direction of the bit line must be increased by the number of division in the direction of the word line, and only after this condition is satisfied, the refresh operation can be made in the same way as in the prior art memories.

[Embodiment 5]

Figure 11:
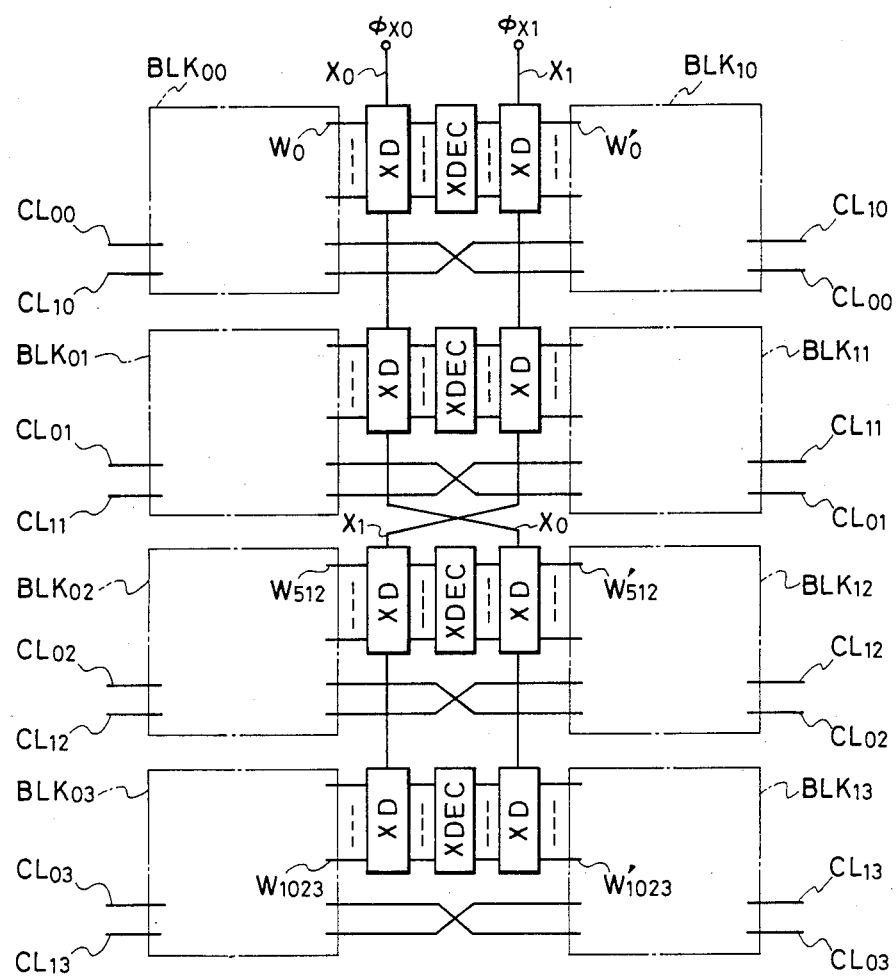
FIG. 11 is a circuit diagram of a fifth embodiment of the present invention.

FIG. 11 is a structural view of the semiconductor memory in accordance with the fifth embodiment of the present invention. This embodiment relates to the refresh operation and changes the selection method of the blocks. In the drawing, NS and PS are omitted. FIG. 2A shows the construction which selects simultaneously the blocks $BLK_{00}$, $BLK_{01}$, $BLK_{02}$ and $BLK_{03}$ by $\phi_{x0}$, for example, but in FIG. 11, the blocks to be selected by $\phi_{x0}$ are $BLK_{00}$, $BLK_{01}$, $BLK_{12}$ and BLK13 and the remaining blocks are selected by $\phi_{x1}$ According to this embodiment, the noise inside the chip occurring during amplification of the signal voltage can be dispersed inside the chip. In other words, since the blocks to be selected simultaneously in FIG. 2A are only either on the right or left of the decoder XDEC, noise coupled with the silicon substrate from the data line through the junction capacitance during amplification of the signal voltage occurs only on one side of the chip and effectively increases the noise quantity at that portion. Particularly when the memory array is formed inside the well of the CMOS structure, local voltage bounce becomes a problem. In FIG. 11, on the other hand, since the blocks to be selected simultaneously are dispersed on the right and left of the decoder XDEC, the noise occurring during the amplification of the signal voltage can be dispersed inside the chip and the increase of local noise can be prevented. In FIG. 11, the blocks which are close to, and away from, the driver ND or PD are simultaneously selected so that the peak current of the power source can be more averaged in comparison with the construction of FIG. 2A. In other words, the peak current when the blocks spaced apart from the driver ND, PD are selected, becomes generally smaller due to the resistance of the common drive line than when the near blocks are selected. Accordingly, the peak current of the chip as a whole can be made averaged and smaller than when only the near or remote blocks are simultaneously selected, particularly when only the near blocks are selected.

[Embodiment 6]

Figure 12:
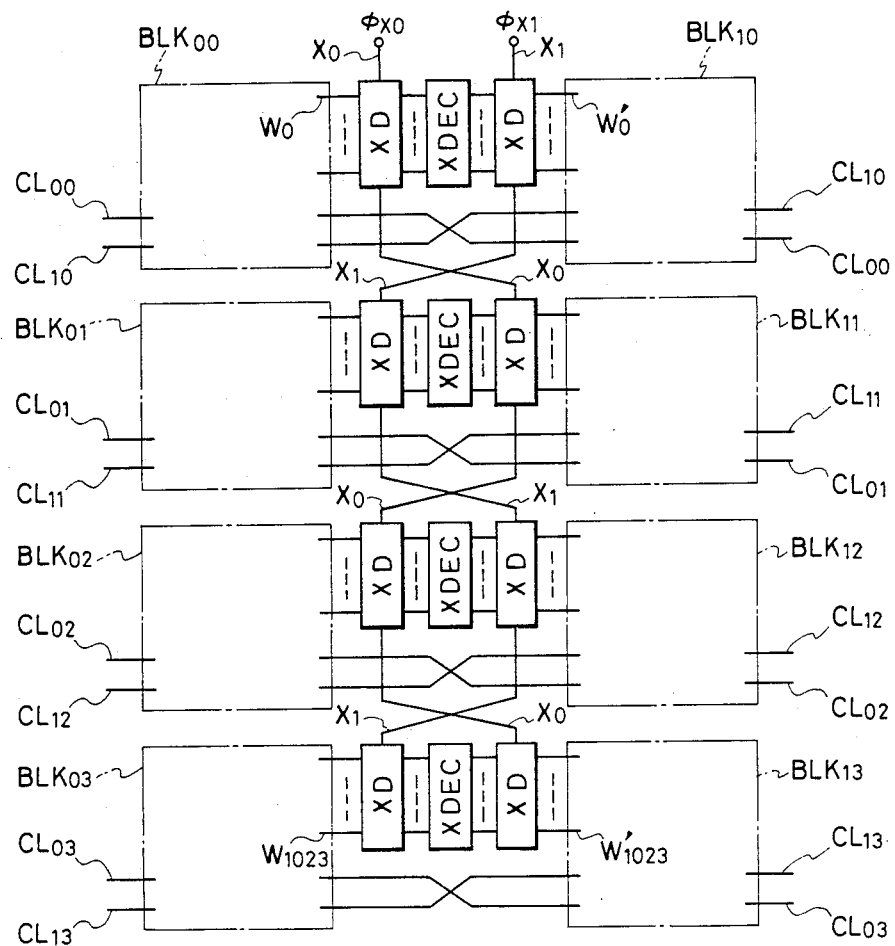
FIG. 12 is a circuit diagram of a sixth embodiment of the present invention.

FIG. 12 is a structural view of the semiconductor memory in accordance with the sixth embodiment of the present invention. This embodiment further modifies the embodiment of FIG. 11 and further disperses the blocks that are to be selected simultaneously. In FIG. 12, the blocks to be selected simultaneously by $\phi_{x0}$ are $BLK_{00}$, $BLK_{11}$, $BLK_{02}$ and $BLK_{13}$. In other words, the blocks on the right and left of the decoder XDEC are alternately selected. In this embodiment, the noise inside the chip can be more dispersed than in the embodiment shown in FIG. 11.

[Embodiment 7]

Figure 13:
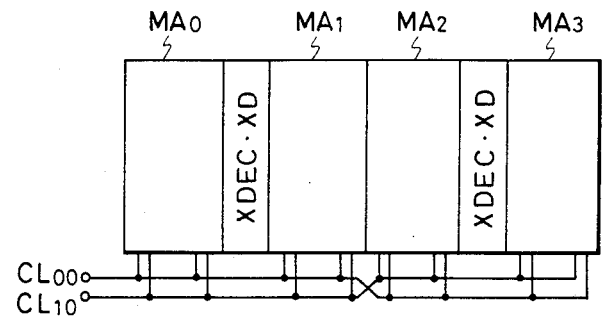
FIG. 13 is a circuit diagram of a seventh embodiment of the present invention.

FIG. 13 is a structural view of the semiconductor memory in accordance with the seventh embodiment of the present invention. This embodiment illustrates the case where the memory array is divided into four arrays in the word line direction. The sense amplifiers NA and PS are omitted for simplification. Among the four divided arrays, the combination of $MA_0$ and $MA_1$ or $MA_2$ and $MA_3$ is selected in order to reduce by half the current flowing through $CL_{00}$, $CL_{10}$ in the same way as in FIG. 2A. It is of course possible to select arbitrary two memory arrays among the four divided arrays and employ the corresponding wiring method of $CL_{00}$, $CL_{10}$ In this embodiment, since the word line is made of a material having relatively high resistance such poly-Si or polycide, this embodiment is effective when the memory array must be divided into a large number of arrays in order to accomplish a high operation speed.

[Embodiment 8]

Figure 14:
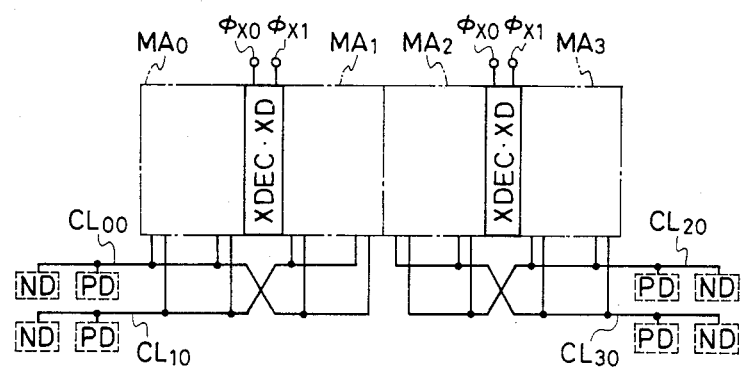
FIG. 14 is a circuit diagram of an eighth embodiment of the present invention.

FIG. 14 is a structural view of the semiconductor memory in accordance with the eight embodiment of the present invention. This embodiment illustrates the case where the memory array is divided into four arrays in the word line direction and the drivers ND, PD are disposed on the common drive lines $CL_{00}$, $CL_{10}$, $CL_{20}$, $CL_{30}$. The sense amplifiers NS, PS are omitted for simplification in the same way as in FIG. 13. Among the four divided memory arrays, the combination of $MA_0$ and $MA_2$ or $MA_1$ and $MA_3$ is selected so as to further reduce by half the current flowing through each common drive line. Furthermore, since the memory array close to the driver PD, ND is selected in combination with the remote array, the peak current of the chip as a whole can be averaged.

[Embodiment 9]

Figure 15:
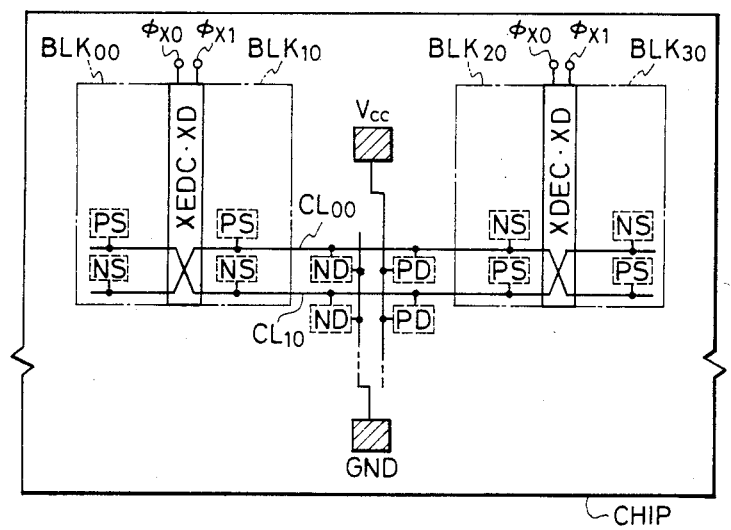
FIG. 15 is a circuit diagram of a ninth embodiment of the present invention.

FIG. 15 is a structural view of the semiconductor memory in accordance with ninth embodiment of the present invention. This embodiment illustrates the arrangement wherein the drivers PD and ND, a circuit for generating the drivers, a peripheral circuit including the I/O circuit and a group of pads are arranged at the chip center, that is, the portion which is encompassed by the memory arrays. In this embodiment, the drivers ND, PD are disposed at the center of the memory arrays to use them in common by the right and left memory arrays. Therefore, the number of drivers can be made smaller than that in FIG. 14. Since the $V_{cc}$ pad and the grounding pad are also disposed at the center, the length of wirings connecting them to the drivers can be reduced, and the wiring resistance can be reduced, too. In FIG. 15, too, the peak current of the chip as a whole can be averaged by selecting the memory arrays close to the drivers PD, ND in combination with remote memory arrays in the same way as in FIG. 14. In FIGS. 13, 14 and 15, it is preferred to arrange those blocks in a checkerboard pattern which are to be selected simultaneously in order to reduce the noise inside the chip as described with reference to FIGS. 11 and 12.

[Embodiment 10]

Figure 16:
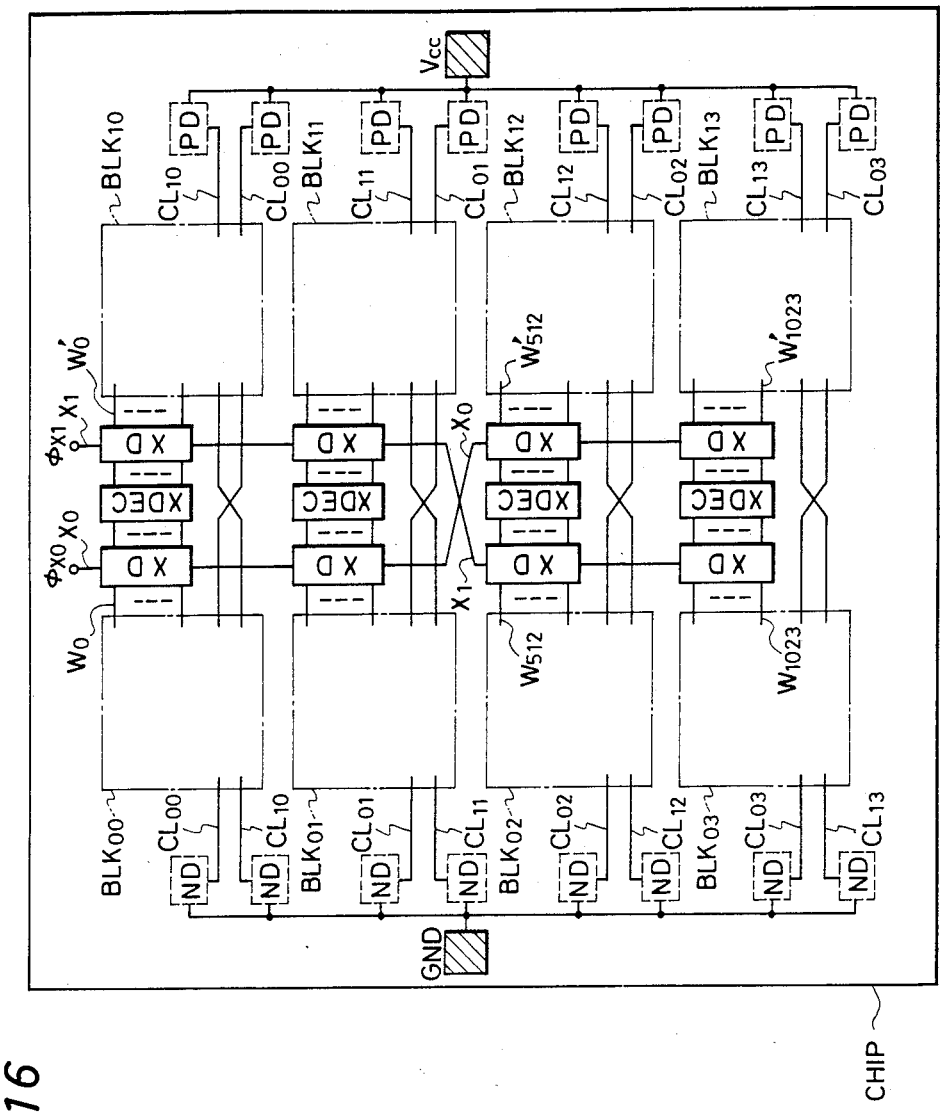
FIGS. 16 and 17 are circuit diagrams and a timing chart of a tenth embodiment of the present invention.

In the foregoing embodiments, the sense amplifier NS consisting of the N-channel transistors is first activated as illustrated in FIGS. 6 and 7. However, sicne both NS and S are the sense amplifiers, it is possible to activate first the sense amplifier PS consisting of the P-channel transistors and then the sense amplifier NS. In such a case, $\phi_{ND0}$, $\phi_{PD0}$ or $\phi_{ND1}$, $\phi_{PD1}$ may be applied in the reverse phase relation. In this system, too, the same effect can be obtained in the same way as in each of the foregoing embodiments. Furthermore, it is possible to let the memory array which activates first the sense amplifier NS and the memory array which activates first PS coexist with each other. FIG. 16 shows such an example.

FIG. 16 is a structural view showing the semiconductor memory in accordance with the tenth embodiment of the present invention. The structure of the memory array is the same as that of FIG. 11, but the difference lies in that only the drivers PD are disposed on each common drive line on the right of the memory array, that is, on the side of the $V_{cc}$ pad, and only the drivers ND are disposed on each common drive line on the left of the memory array, that is, on the side of the grounding pad.

Figure 17:
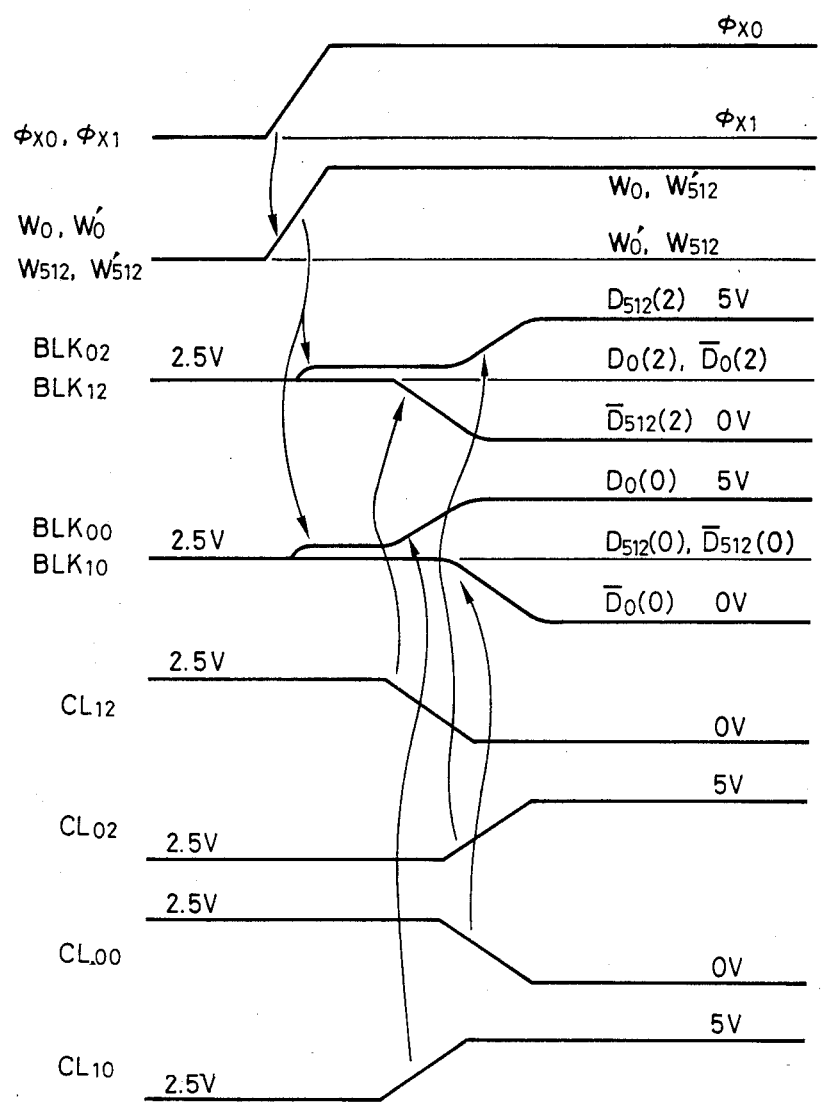

FIG. 17 is an operation time chart of FIG. 16. First of all, the pulses are applied by the signal $\phi_{x0}$ to the word line $W_0$ inside the block $BLK_{00}$ and to the word line $W_{512}$, inside the block $BLK_{12}$, and the signals are read out on the data line of each block, such as $D_0(0)$, $D_{512}(2)$. Next, the sense amplifier PS consisting of the P-channel transistors inside the block $BLK_{00}$ is activated by raising the common drive line $CL_{10}$ from 2.5 V to 5 V by the driver PD. On the other hand, the sense amplifier NS consisting of the N-channel transistors inside the block $BLK_{12}$ is activated by lowering the common drive line $CL_{12}$ from 2.5 V to 0 V by the driver ND. Thereafter, NS is activated inside the block $BLK_{00}$ while PS is activated inside the block $BLK_{12}$ in order to complete the amplification of the read signal on the data line inside each block. It is important among the operation shown in FIG. 17 that among the two kinds of sense amplifiers PS and NS, the sense amplifier in each block which is remoter from the driver PD, ND is first activated. In the block $BLK_{00}$, for example, PS is remoter than PD and is hence activated first.

It is known that the lower the fall speed of the common drive line in the case of NS (the rise speed in the case of PS), the smaller the noise at the time of amplification of the signal. Therefore, the noise during amplification of the signal is smaller in the case of the same signal quantity than the noise by amplification of NS spaced apart from the driver ND (or PD), because the fall speeds of the common drive lines are different. Therefore, in the embodiment shown in FIG. 17, the sense amplifier having a greater distance from the driver is first activated and after amplification is made sufficiently by this sense amplifier, amplification is then made to the maximum amplitude (5 V) by the other sense amplifier. Since the time at which PS (or NS) is activated is different between the blocks $BLK_{00}$ and $BLK_{12}$, the peak position of the power source current occurring in each block is different timewise so that the peak current of the chip as a whole can be reduced.

It is also possible to activate substantially simultaneously both the sense amplifiers NS and PS. When they are activated at the same time, the noise coupled with the silicon substrate from the data line through the junction capacitance can be offset because the system is the folded data line cell system which precharges the data line to 2.5 V, and the memory operation can be made stably.

In the foregoing embodiment, when the sense amplifier such as ND is operated, it is operated by one driver ND. In order to reduce the noise during amplificaiton, however, it is also possible to connect two drivers having different driving capacity in parallel with each other, to first activate the driver having the lower driving capacity to make amplification of the signal voltage on the data line to some extents and then to activate the driver having higher driving capacity so as to sufficiently amplify the signal voltage.

[Embodiment 11]

Figure 18:
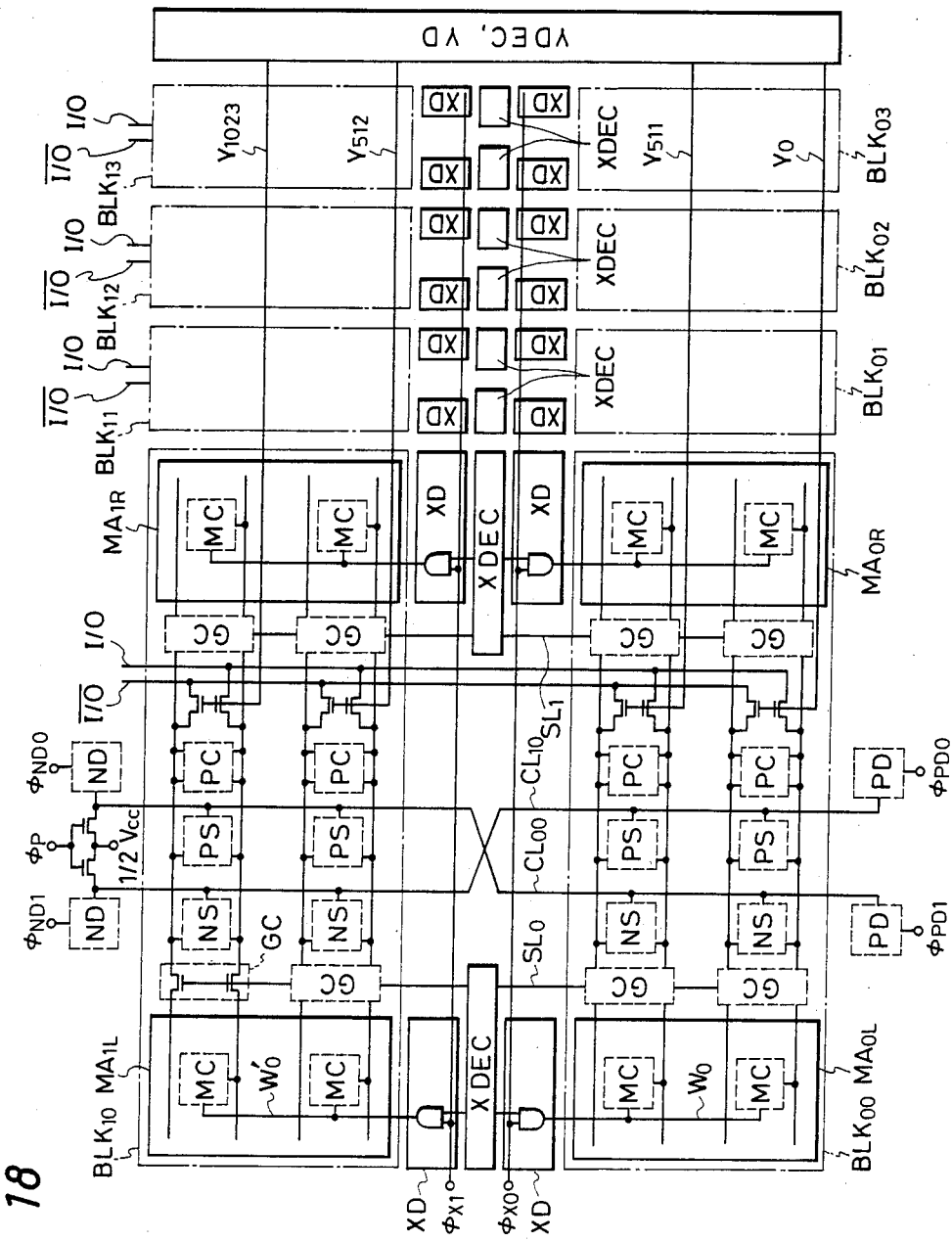
FIG. 18 is a circuit diagram of an eleventh embodiment of the present invention.

FIG. 18 is a structural view of the semiconductor memory in accordance with still another embodiment of the present invention. This embodiment adds a memory array selector switch GC to the embodiment shown in FIGS. 4 and 5 to further halve each of the sub-arrays $MA_0$ and $MA_1$ into total four sub-arrays $MA_{0L}$, $MA_{0R}$, $MA_{1L}$ and $MA_{1R}$. Moreover, the sense amplifiers NS, PS, the precharge circuit PC, the I/O lines, and the like, are arranged in between the divided sub-arrays divided through GC. When GC is turned on or off, the sub-arrays $MA_{0L}$ and $MA_{0R}$ or $MA_{1L}$ and $MA_{1R}$ share in common the sense amplifiers, and the like. The memory array selector switch GC is controlled by control lines $SL_0$, $SL_1$ and is brought into the selection state by the X decoder. Under this construction, when the memory cells in the subarray $MA_{0L}$ are selected, for example, a high voltage is applied to $SL_0$ before the word line is turned on and GC on the $MA_{0L}$ side is turned on so that $MA_{0L}$ is connected to the sense amplifiers, and the like. On the other hand, 0 V is applied to $SL_1$ to turn off GC on the $MA_{0R}$ side and to cut off from the sense amplifiers, and the like. The operation after GC is brought into such a selection state is the same as that of the embodiment shown in FIG. 6. Namely, one word line inside MA$_{OL}$ is turned on and the memory cell read-out signal voltage is outputted to the data line pair inside MA$_{OL}$ and is amplified by the sense amplifiers. On the other hand, MA$_{OR}$ is under the non-selection state, and the data line pair in this sub-array keep the precharge state. Here, the voltage applied to SL$_0$ must be such a value so that the data can be sufficiently written into the memory cell. In other words, if the threshold value of the transistor forming GC is V$_T$, the voltage applied to SL$_0$ must be at least V$_{cc}$+V$_T$.

In accordance with this embodiment, since the data line can be further halved without increasing the number of sense amplifiers in comparison with the embodiment shown in FIG. 4, the parasitic capacitance per data line can be reduced by half and the memory cell read-out signal voltage read out onto the data line pair can be increased by about twice. Accordingly, S/N can be increased, too. Since the sub-arrays on the non-selection side keep the precharge state, the parasitic capacitance of the data lines charged and discharged during amplification by the sense amplifiers can be reduced by about half when compared with the embodiment shown in FIG. 4, and the consumed power as well as the peak value of the spike current of the power source can be reduced. Furthermore, since the I/O lines are disposed at the center and between the divided sub-arrays, there occurs no difference in the read or write speed between the sub-arrays MA$_{OL}$ and MA$_{OR}$ (or MA$_{IL}$ and MA$_{IR}$).

In accordance with the present invention described above, the current flowing through the common drive lines of the sense amplifiers during amplification can be reduced by half while keeping the low noise characteristics. Since the width of wirings can be reduced in the corresponding manner, the chip area of the semiconductor memory can be reduced, too.

It is to be noted by those skilled in the art that the foregoing description deals with some preferred embodiments of the disclosed invention and that various changes and modifications may be made in the invention without departing from the spirit and scope thereof.

What is claimed is:

1. A semiconductor memory including at least first and second blocks, each block comprising: a plurality of word lines; a plurality of data lines disposed in such a manner as to cross said word lines; a plurality of memory cells disposed at the points of intersection of said word lines and said data lines; and a plurality of sense amplifiers for amplifying data when the data of said memory cells is read out on said data line; wherein said plurality of sense amplifiers includes N-channel MOS transistor sense amplifiers and P-channel MOS transistor sense amplifiers;

wherein when said N-channel MOS transistor sense amplifiers within said first block receive an activating voltage, said P-channel MOS transistor sense amplifiers within said second block receive a deactivating voltage, and when said P-channel MOS transistor sense amplifiers within said first block receive an activating voltage, said N-channel MOS transistor sense amplifiers within said second block receive a deactivating voltage; and wherein the activating voltage of the N-channel MOS transistor sense amplifiers and the deactivating voltage of the P-channel MOS transistor sense amplifiers are substantially the same voltage, and the deactivating voltage of the N-channel MOS transistor sense amplifiers and the activating voltage of the P-channel MOS transistor sense amplifiers are substantially the same voltage.

2. A semiconductor memory according to claim 1, wherein said word lines within said first and second blocks are driven by a first and second word line drivers, respectively.

3. A semiconductor memory according to claim 1, wherein said second block does not perform a refresh operation when said first block performs a refresh operation, and said first block does not perform a refresh operation when said second block performs a refresh operation.

4. A semiconductor memory according to claim 1, wherein a line of said N-channel MOS first drive line comprises a drive transistor sense amplifiers within said first block P-channel MOS connected to a drive line of said transistor sense amplifiers within said second block and a second drive line comprises a drive line of said P-channel MOS transistor sense amplifiers within said first block connected to a drive line of said N-channel MOS transistor sense amplifiers within said second block.

5. A semiconductor memory according to claim 4, wherein said first and second drive lines do not cross one another.

6. A semiconductor memory acoording to claim 4, wherein said sense amplifiers within said first block and comprised of said P-channel MOS transistors and said sense amplifiers within said second block and comprised of said N-channel MOS transistors are disposed at positions within said first and second blocks corresponding to each other, said sense amplifiers within said first block and comprised of said N-channel MOS transistors and said sense amplifiers with said second block and comprised of said P-channel MOS transistors are disposed at positions within said first and second blocks corresponding to each other, and said first and second drive lines are substantially in parallel with one another.

7. A semiconductor memory according to claim 4, wherein said first and second drive lines both have at a first end thereof first drivers comprised of N-channel MOS transistors and said first and second line drivers both have at a second end thereof second drivers comprised of P-channel MOS transistors, respectively, and said first and second drivers are disposed near the center of the chip on which said memory is disposed.

8. A semiconductor memory according to claim 4, wherein said memory cell includes a capacitor for storing data and a transistor for accessing said data during read and write operations.

9. A semiconductor memory according to claim 4, wherein said semiconductor memory is disposed on a semiconductor chip, said first and second drive liens both have at a first end thereof first drivers comprised of N-channel MOS transistors and said first and second drive lines both have at a second end thereof second drivers comprised of P-channel MOS transistors, a terminal for grounding said semiconductor memory is disposed on a portion of the surface of the semiconductor chip in which said first drivers are disposed, and a terminal for the application of a power source voltage to said semiconductor memory is disposed on another portion of the surface of said semiconductor chip in which said second drivers are disposed.

10. A semiconductor memory according to claim 9, wherein said first and second drive lines of said sense amplifiers do not cross the boundaries between said blocks by reversing the position of said sense amplifiers comprised of said N- and P-channel MOS transistors of a succeeding block relative to a preceding block.

11. A semiconductor memory including a plurality of blocks each comprised of at least one memory cell array and sense amplifiers for differentially amplifying a signal read out from said memory cell array, wherein a common drive line of sense amplifiers which are comprised of N-channel MOS transistors is connected to a common drive line of sense amplifiers which are comprised of P-channel MOS transistors between different blocks.

12. A semiconductor memory according to claim 11, wherein all sense amplifiers are of such a type that only word lines within one of the blocks are selected and only sense amplifiers corresponding to the selected word lines are activated.

13. A semiconductor memory according to claim 11, wherein a driving circuit for said sense amplifiers comprised of N-channel MOS transistors is disposed on the left of a first block of a plurality of blocks when a terminal for a grounding power source is disposed on the left of said first block and wherein a terminal for a $V_{cc}$ power source is disposed on the right of a second block of a plurality of blocks, when a driving circuit for said sense amplifiers comprised of P-channel MOS transistors is disposed on the right of said second block.

* * * * *